United States Patent [19]

Bäumler et al.

[11] Patent Number: 5,075,822
[45] Date of Patent: Dec. 24, 1991

[54] HOUSING FOR INSTALLATION IN MOTOR VEHICLES

[75] Inventors: Heinz Bäumler, München; Richard Hoffmann, Gaimersheim; Klaus Schirmer; Otto Zeides, both of Ingolstadt, all of Fed. Rep. of Germany

[73] Assignee: Telefunken electronic GmbH, Heilbronn, Fed. Rep. of Germany

[21] Appl. No.: 473,456

[22] Filed: Feb. 1, 1990

[30] Foreign Application Priority Data

Mar. 4, 1989 [DE] Fed. Rep. of Germany ....... 3906973

[51] Int. Cl.⁵ .............................................. H05K 7/20
[52] U.S. Cl. .................................. 361/388; 123/41.31; 123/647; 165/80.3; 361/395
[58] Field of Search ............................. 174/16.3; 357/81; 165/80.3, 185; 361/383, 386–389, 395, 399, 424; 123/41.31, 647

[56] References Cited

U.S. PATENT DOCUMENTS

| | | |
|---|---|---|
| 4,177,499 | 12/1979 | Volkmann ............................ 361/388 |
| 4,397,291 | 8/1983 | Johnson . |
| 4,557,225 | 12/1985 | Sagues et al. . |
| 4,674,005 | 6/1987 | Lacz . |
| 4,716,498 | 12/1987 | Ellis ...................................... 361/386 |
| 4,905,123 | 2/1990 | Windle ................................. 361/386 |
| 4,923,179 | 5/1990 | Mikolajczak ........................ 361/386 |

FOREIGN PATENT DOCUMENTS

| | | |
|---|---|---|
| 0309986 | 4/1989 | European Pat. Off. . |
| 2303087 | 9/1974 | Fed. Rep. of Germany . |
| 2546334 | 4/1977 | Fed. Rep. of Germany . |
| 2552682 | 6/1977 | Fed. Rep. of Germany . |
| 2753145 | 6/1979 | Fed. Rep. of Germany . |
| 2753914 | 6/1979 | Fed. Rep. of Germany . |
| 3307654 | 9/1984 | Fed. Rep. of Germany . |
| 8317699 | 11/1984 | Fed. Rep. of Germany . |
| 3502584 | 7/1986 | Fed. Rep. of Germany . |
| 3514440 | 10/1986 | Fed. Rep. of Germany . |
| 3703088 | 8/1988 | Fed. Rep. of Germany . |

Primary Examiner—Gerald P. Tolin
Attorney, Agent, or Firm—Spencer & Frank

[57] ABSTRACT

The invention relates to a housing for installation in motor vehicles to hold electronic components arranged on a PCB. In accordance with the invention, the housing comprises a trough-shaped housing section and a metal lid. In addition, several heat sinks are arranged on the PCB, with the PCB being firmly connected exclusively to these heat sinks. Here, the heat sinks are designed such that they are in direct contact with both the housing section and the metal lid.

9 Claims, 4 Drawing Sheets

PRIOR ART

HOUSING FOR INSTALLATION IN MOTOR VEHICLES

BACKGROUND OF THE INVENTION

The invention relates to a housing for installation in motor vehicles to hold electronic components arranged on a PCB, and to the use of such a housing.

In motor vehicles, electronic control systems whose assemblies are accommodated in housings are in increasing use in order to provide protection from the loads and disturbances occurring in operation.

For example, electro-magnetic (EMV) disturbance can have a negative effect on the operation of electronic assemblies. Also, an electronic assembly of this type can itself be the source of such disturbances, which can then have a disturbing effect on other electronic assemblies. To suppress such disturbances, the electronic components are installed in metal housings, designed for example as aluminum die-cast housings, folded housings or extruded housings, or in metallized plastic housings.

At the same time, a metal housing of this type is used for dissipating the heat from the electrical power loss, this being ensured by the additional use of cooling fins at an ambient temperature of −40° C. to +120° C. A metal housing of this type is shown in FIGS. 1 and 2, with FIG. 1 being a plan view of the housing parts and FIG. 2 a section through the housing in accordance with FIG. 1. This housing comprises a frame section 1 and two housing lids 2a and 2b, the frame section 1 being made as an aluminum die-cast housing and the two housing lids 2a and 2b of aluminum. This housing holds the PCB 3, equipped in SMD technology with the electrical SMD components, the power transistors 12, and the plug 11. The plug 11 is connected to the PCB 3 through the holes 5. This fitted PCB 3 is inserted into the frame section 1 as indicated by the arrow 22 in FIG. 1. The PCB 3 is fixed in the frame section 1 by webs 15 and 16 provided in the frame section 1 and having a spacer pin 15a and 16a, respectively, each of which also contains a hole 4 for fastening the PCB 3 using four screws 20. Here, the two webs 15 connect the two longitudinal sides of the rectangular frame section 1 in the area of the edges of the two short sides of the frame section 1. The two other short webs 16 project from one longitudinal side into the frame section 1. Two large-area flange pieces 8 are arranged on the side opposite this longitudinal side. In accordance with FIG. 2, it can be seen that the four webs 15 and 16 each have a spacer pin 15a or 16a, respectively. The PCB 3 rests on these four spacer pins 15a and 16a and is screwed using the screws 20 through the holes 5a in the PCB 3 to the spacer pins 15a and 16a. Here, the power transistors 12 on the edges of the two short sides of the PCB 3 are arranged so that their respective cooling surfaces are in contact with the outer surfaces of the frame section 1. There, on these outer surfaces of the short sides of the frame section 1, cooling fins 10 are provided for improving heat dissipation. Fastening holes 9 are additionally provided on these cooling fins 10. Expanding means 13 are inserted between the power transistors 12 and the webs 15 so that the power transistors 12 are pressed against the outer surfaces of the frame section 1. Finally, the two housing lids 2a and 2b are screwed to the frame section 1 through the holes 19 using screws 21 and 21a. The holes 4a provided on both sides of the frame section 1 are used for this purpose. The frame section 1 has an offset edge 7 on both sides which is used to lock the two housing lids 2a and 2b. Before these housing lids are fitted, a silicone compound is positioned in this edge 7 in order to hermetically seal the housing.

A housing structure of this type as described above has a number of drawbacks. Since the frame section is made using an aluminum die-cast process, the contact surface provided for the PCB 3 by the four spacer pins 15a and 16a has a high degree of evenness. However, the PCB 3 is so distorted by the soldering process that the surface formed by the PCB is no longer even, and so does not correspond to the contact surface. The PCB 3 is now clamped into the contact surface by screwing it there with these spacer pins, with the result that torsional forces now act on it which can be transmitted to the conducting paths and electronic SMD components, so that cracks and breaks cannot be ruled out and may even cause an operational failure. Furthermore, the connecting wires of the power transistors 12 are, due to unfavourable tolerance combinations in the PCB 3 and the frame section 1, subjected by the expanding means 13 to lateral forces which can also cause operational failures.

Finally, assembly of this known housing is difficult due to its many parts and awkward handling, and therefore leads to high production costs.

SUMMARY OF THE INVENTION

The object of the invention is to provide a housing of the type mentioned above that permits a stress-free installation of the PCB into the housing and that is quick and simple to assemble.

According to the invention, it is provided in a housing of the type mentioned at the outlet that the housing comprises a trough-shaped housing section and a metal lid, that several heat sinks are arranged on the PCB, with the PCB being firmly connected exclusively to these heat sinks, and that the heat sinks are designed such that they are in direct contact with both the housing section and the metal lid.

In this solution in accordance with the invention, heat sinks are fastened on the PCB, with the power transistors arranged on the PCB being held in contact with these heat sinks by clips. The power transistors thus fixed can be subjected together with the SMD components to a soldering process in which unfavourable tolerances no longer occur that might act as lateral forces on the connecting wires of the power transistors. The PCB fitted with the electrical SMD components and the heat sinks can now be simply inserted into the trough-shaped housing section and connected to the housing section by the heat sinks. The heat generated by the power transistor energy loss is first removed via the heat sinks and then spread over the metal lid in contact with the heat sink. Since there is no need for a second lid as used in the prior art, the assembly work is reduced. In addition, the PCB is installed stress-free, so that no torsional forces can act any longer on the PCB with the SMD components.

In an advantageous embodiment of the invention, the heat sinks have at least one hole, using which both the metal lid and the housing section are firmly connected to the heat sink using a single screw connection. This results in a further reduction of the assembly work, since it is now no longer necessary to connect separately the PCB and the housing section and then the housing lid and the housing section, but the housing section, the PCB and the metal lid are connectable to one another in a single operation.

In accordance with another preferred embodiment of the invention, the PCB is designed rectangular and has on each of its opposite short sides a heat sink extending over the entire width of the PCB, with the heat sink being designed in rod form and having an almost rectangular cross-section, in accordance with a further embodiment of the invention. A particularly favourable embodiment has two heat sinks for fitting underneath with which optimum area exploitation of the PCB is achieved as well as a mechanically well-stabilized PCB attachment through these heat sinks.

In a further advantageous embodiment of the invention, the two heat sinks on the PCB are so designed that they have projections at the edges of the long side of the PCB, with each projection containing a hole for simultaneous fitting of the PCB, the metal lid and the frame section.

Since it has been determined by EMV measurements that assemblies with multiple-conductor connecting cables receive and transmit EMV disturbances for the greater part from the attached cables, the shielding effect of a closed metal housing can be dispensed with. For this reason, the trough-shaped housing section is made of plastic in a particularly preferred embodiment of the invention, preferably by injection molding. The result is an inexpensive manufacturing process compared to an aluminum die-casting method, as high tool costs per piece are not incurred. In addition, a lower weight is achieved for the assembly, which is particularly welcome in automotive engineering. An adequate EMV shielding effect and a sufficient heat dissipation is achieved by the metal lid, which is made of aluminum in accordance with a further embodiment of the invention.

BRIEF DESCRIPTION OF THE DRAWINGS

The following describes the invention in greater detail on the basis of an embodiment with the aid of drawings, in which.

Identical parts in the drawings are given the same reference number.

DESCRIPTION OF THE PREFERRED EMBODIMENTS

Figure 1:
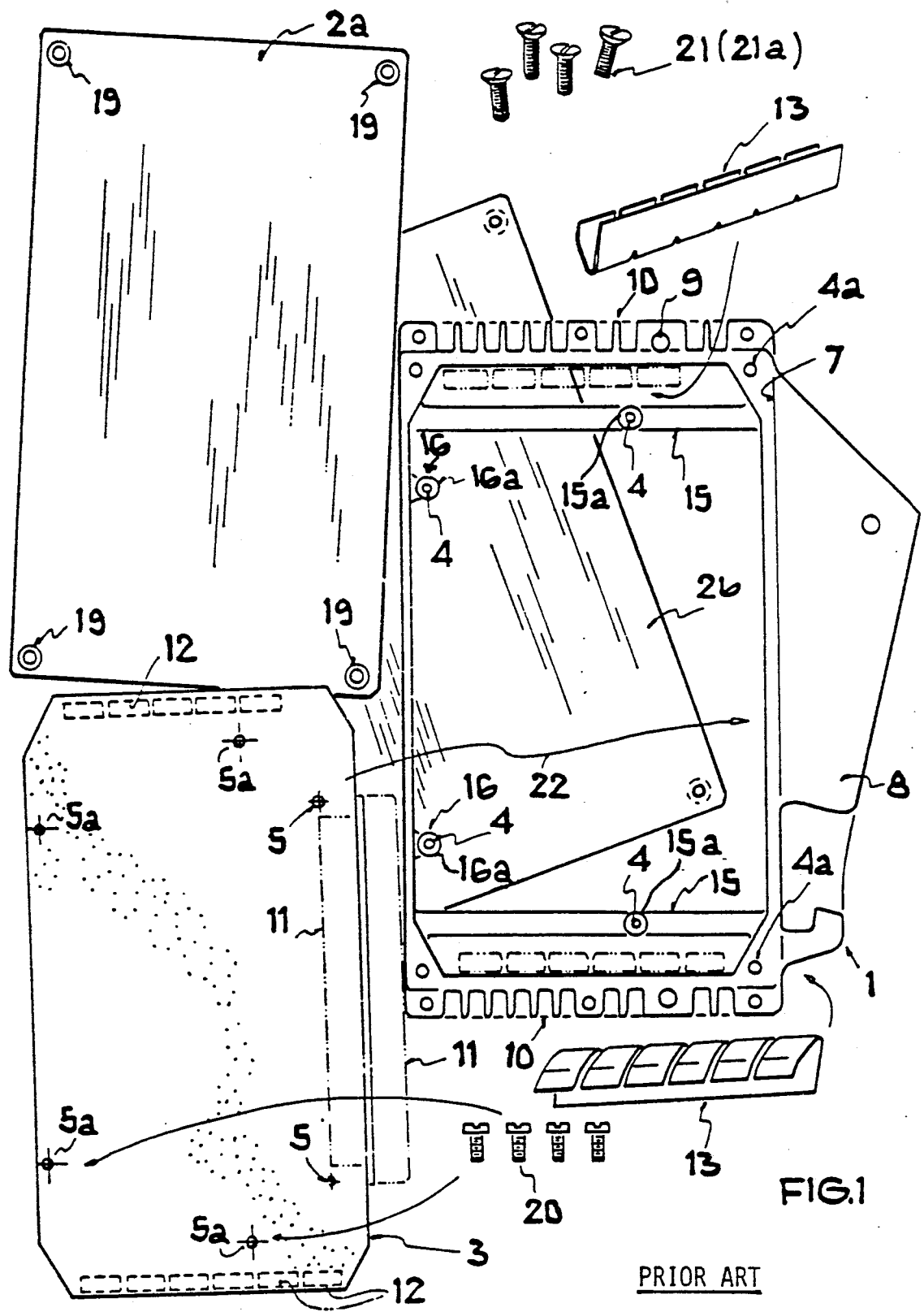
FIG. 1 is a plan view of a housing according to the prior art.
Figure 2:
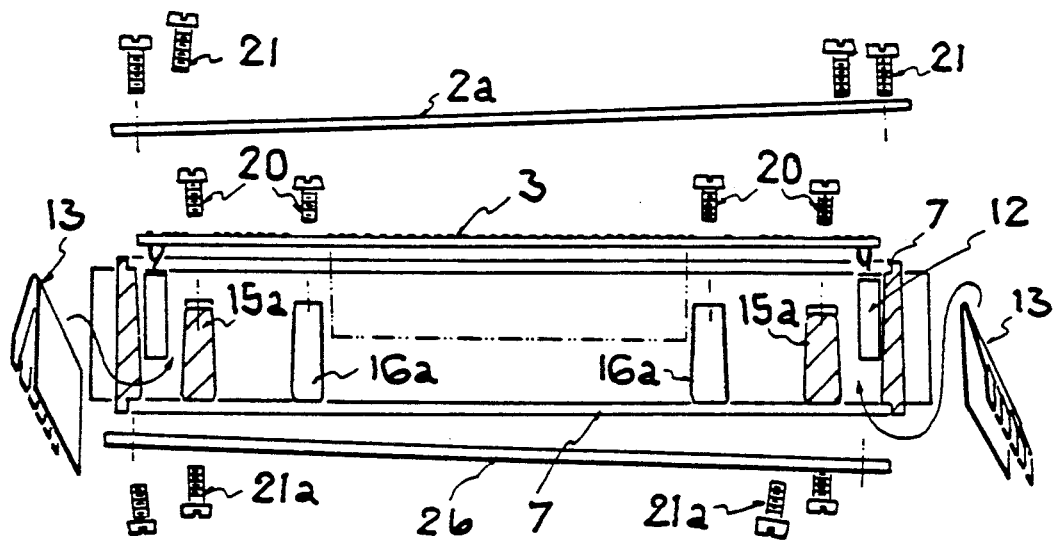
FIG. 2 is a section through the known housing according to FIG. 1.
Figure 4:
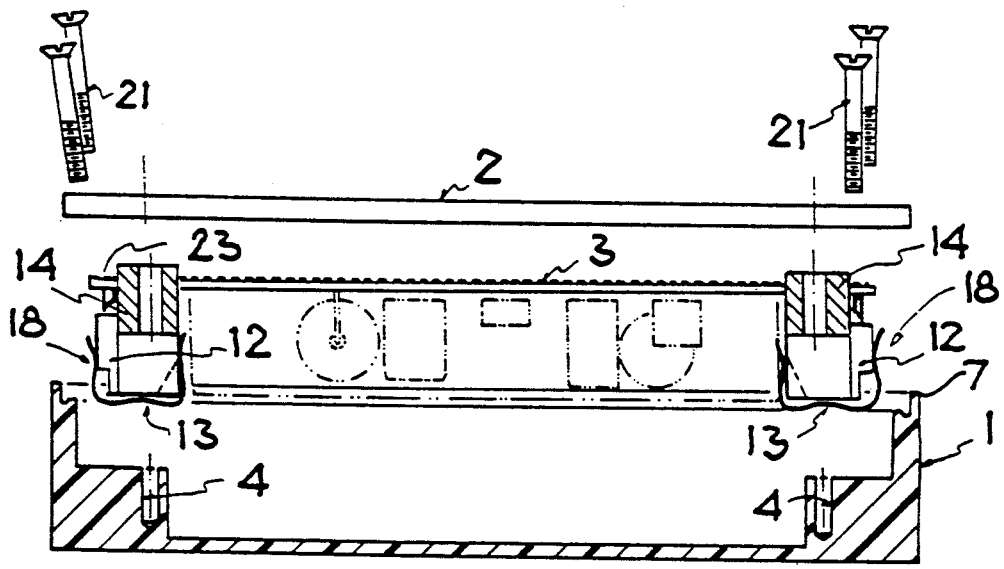
FIGS. 4 and 5 are sections through the embodiment of the housing in accordance with the invention according to FIG. 1.
Figure 3:
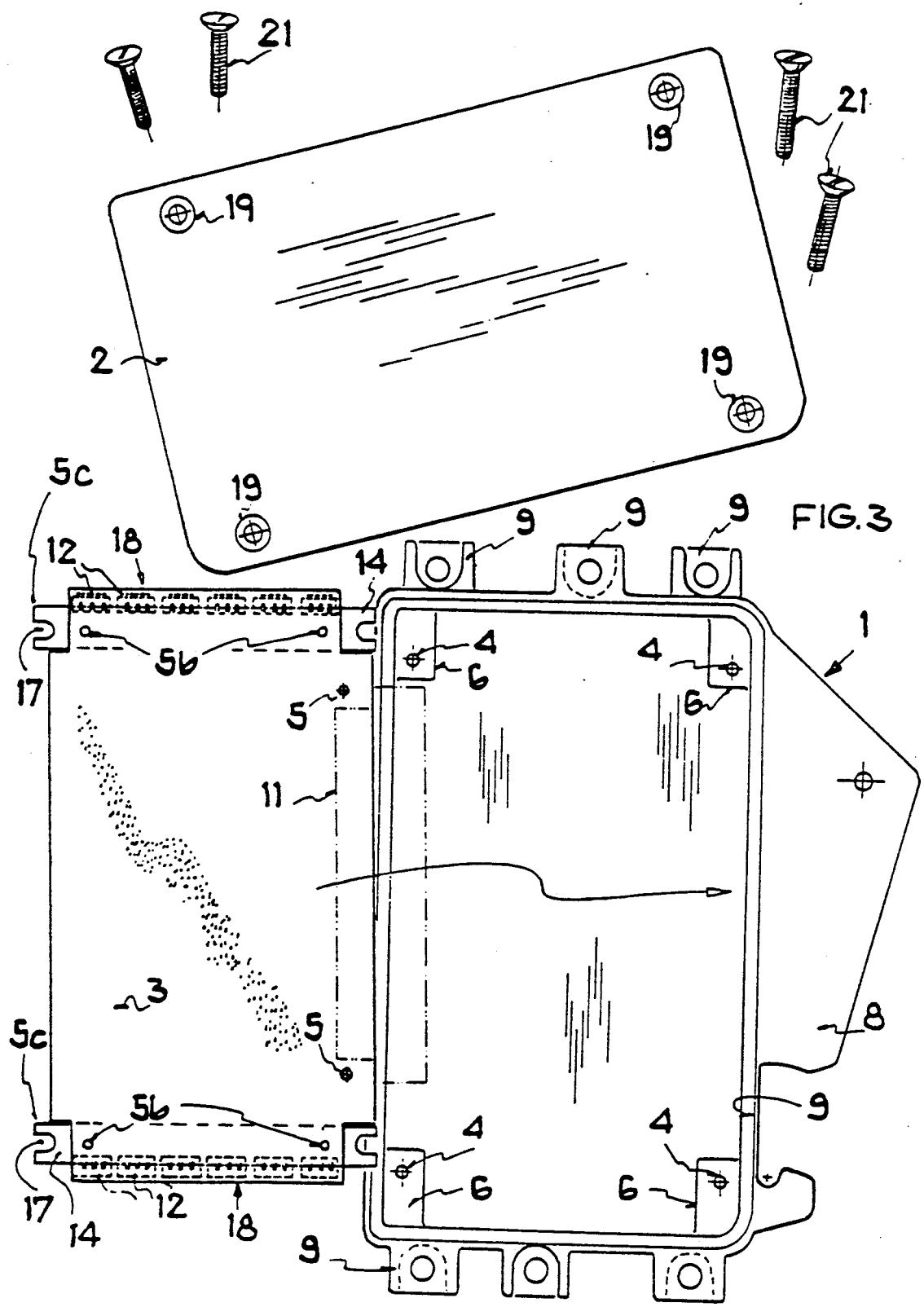
FIG. 3 is a plan view of the parts of an embodiment of a housing in accordance with the invention.

The housing in accordance with the invention according to FIG. 3 is a plan view of the trough-shaped housing section 1, the PCB 3 fitted with two heat sinks 14, a plug 11, the power transistors 12 and other electronic components in SMD technology, and the metal lid 2. The housing section 1 is designed as a rectangular trough whose form is made clear in the sectional representations in FIGS. 4 and 5. In FIG. 4 the section is longitudinal, with the housing section 1, the PCB 3 and the metal lid 2 pulled apart in their installation position in the form of an exploded view, whereas the section in FIG. 5 is parallel to the short side of the housing section 1, with the housing completely assembled.

Figure 5:
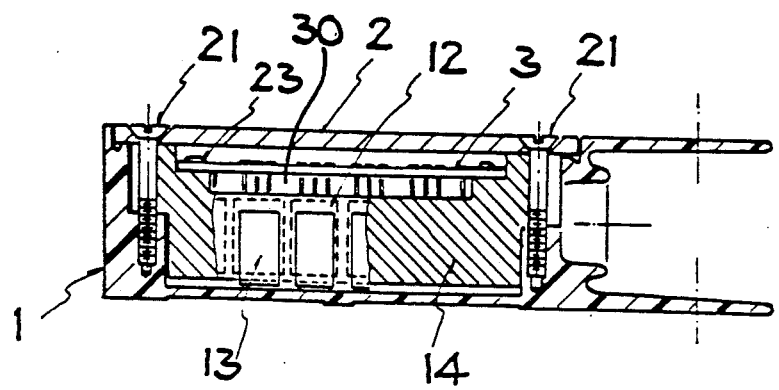

The two heat sinks 14 are designed in rod form in accordance with FIGS. 3, 4 and 5, with almost rectangular cross-section, and fit over the two short sides of the rectangular PCB 3 across its entire width, and project above the PCB at its corners with rectangular cutouts 5c in such a way that a hole 17 is provided on each of these projecting ends of the heat sinks 14. The heat sinks 14 are each permanently connected through two holes 5b in the PCB 3 with the latter, for example, by rivets. In addition, the projections at the ends of the heat sinks 14 are so designed that they also project beyond the plane of the PCB 3 in order to ensure a certain distance to the metal lid 2 resting on these projections of the heat sinks 14 after assembly, cf. FIGS. 4 and 5. The power transistors 12 are arranged along the short edge of the PCB 3 so that their cooling surfaces are in contact with the outer surfaces 18 of the two heat sinks 14, against which they are pressed by a clip 13 enclosing the heat sink 14 and the power transistors 12.

The projections of the heat sinks 14 are furthermore so designed that they rest as flanges on the bases with the holes 4, these bases being provided in the corners of the trough-shaped housing section 1, in order to maintain a certain distance between the PCB 3 and the housing bottom of the housing section 1. The thickness of the flange at the end of each heat sink 14 is selected here such that it corresponds to the distance between the cover surfaces of the aforementioned bases and of the inner edge of the housing section 1, so that the lid 2 seals flush with the edge of the housing section 1 after installation of the PCB 3 in the housing section 1, as can be seen from FIG. 5.

Finally, each of the two heat sinks 14 has on its side facing the PCB 3 and between the two rivet connections 23, a cutout region 30 in accordance with FIG. 5, that prevents the heat sinks 14 contacting the PCB 3 in the cutout region, as a result of which the heat sink 14 can be fitted underneath the PCB 3.

FIGS. 4 and 5 now show how the metal lid 2, the heat sinks 14 and the housing section 1 are firmly connected at the same time using four screws 21 through the holes 19 in the metal lid 2, the holes 17 in the heat sinks 14, and the holes 4 in the housing section 1.

In the embodiment shown in FIGS. 3, 4 and 5 of a housing in accordance with the invention, the electronic components are arranged on that side of the PCB 3 facing the housing bottom of the housing section 1.

Figure 6:
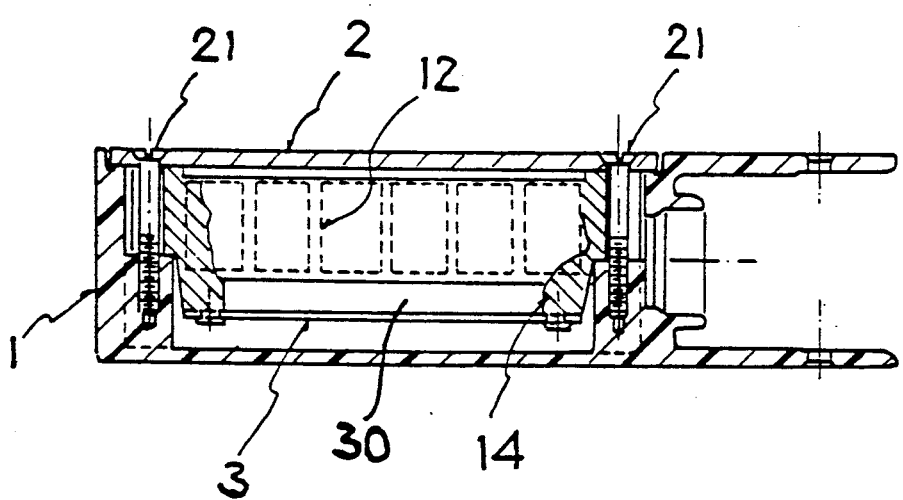
FIG. 6 is a section through a further embodiment of a housing in accordance with the invention.

However, it is possible by appropriate design of the heat sinks 14 and of the base with the holes 4 in the housing section 1 to fit the assembly in such a way that the PCB 3 is on the bottom of the trough of the housing section 1 and the electronic components are arranged in the space between the PCB 3 and the lid 2. An embodiment of this type is shown by FIG. 6 in a section corresponding to FIG. 5.

A trough-shaped housing section 1 can be made of plastic in an injection molding process, thereby achieving a considerable reduction in production costs compared with a metal housing, since making a metal housing in an aluminum die-casting process involves a high tool cost allocation to the unit price in view of the production rate per tool. In addition, the use of plastic also leads to a lower weight for the assembly, which conforms to the requirements of automotive engineering.

The metal lid 2 is made of chromatized aluminum for corrosion protection reasons, and is used for heat dissipation since it is in direct contact with the heat sink 14.

As already set forth above, an adequate EMV shielding effect is achieved with this metal lid 2 in most cases. If however a closed metal housing is necessary for highly sensitive electronic assemblies, it is possible in spite of the plastic housing section 1 to achieve a low-cost shielding effect in the following manner. A trough-shaped punched/bent part is made from a thin metal sheet approx. 0.2 to 0.3 mm thick and placed in the trough-shaped housing section 1. This part has, on that side of the housing section 1 adjacent to the flange 8, a pulled-up tab and four angular projections for mounting on the bases with the holes 4. During assembly, these angular projections come to rest on these bases, so that the lower flange surfaces of the heat sinks 14 press on them. The inserted trough, the lateral heat sinks 14 and the aluminum lid 2 therefore make up a closed metal cage that ensures shielding and obviates the need for expensive metal-plating of the plastic housing section 1.

The procedure for making a ready-to-fit PCB 3 in accordance with the embodiment can also be conducted economically and therefore at low expense. The heat sinks can be accurately attached to the PCB with the aid of a suitable device, the plug 11 is then fitted, and the electronic components are then arranged on the PCB, the power transistors 12 being clamped to the heat sink 14 at once using the clamps 13, so that the soldering process can then follow. As a result, mechanical stresses on the connecting wires of the power transistors no longer occur that might have a detrimental effect on these components.

In addition, the PCB is fixed in its final installation position by the heat sink during the soldering process. Finally, immersion painting is carried out, in which the PCB is only coated up to the plug, resulting in a minimum paint consumption since further external housing parts are not present. This leads to a better visual appearance.

Final assembly can now be performed, as already set forth, quite simply with only four screws, so that the amount of components and handling is minimized.

For compensation of the elongation between the plastic housing section 1 and the aluminum lid 2, sealing material is preferably used as the sealant, since an ambient temperature of −40° C. to +120° C. is approved in automotive engineering. This seal can be dispensed with if the unit is not installed in the engine compartment, but in the interior of the vehicle.

The above embodiment of a housing in accordance with the invention can be advantageously used in automotive engineering, for any car electronic suitable for engine compartments, for example for an electronic ignition and ABS system.

What is claimed is:

1. A housing for installation in motor vehicles and having therein electronic components arranged on a PCB, wherein said housing comprises a trough-shaped single member housing section and a metal lid contacting and attached to said housing section, wherein a plurality of heat sinks are arranged within said housing section, wherein said PCB is mechanically connected exclusively to said heat sinks, and wherein said heat sinks are in direct contact with both said housing section and with said metal lid.

2. A housing according to claim 1, wherein the heat sinks each have at least one hole, and wherein both the metal lid and the housing section are firmly connected to the heat sinks using a respective single screw extending through each said at least one hole.

3. A housing according to claim 2, wherein the PCB is rectangular, wherein two said heat sinks are provided, and wherein a respective heat sink extends on each of the opposite short sides over the entire width of said PCB.

4. A housing according to claim 3, wherein each said heat sink is rod-shaped with an approximately rectangular cross-section.

5. A housing according to claim 3, wherein each said heat sink is fastened to said PCB at two locations adjacent opposite sides of said PCB, and wherein the surface facing said PCB of each said heat sink between said two locations is recessed, whereby each said heat sink can extend underneath said PCB.

6. A housing according to claim 3 wherein the two heat sinks have projections at the edges of the long side of the PCB, and wherein each projection contains a respective said hole for receiving a respective said screw.

7. A housing according to claim 1, wherein the trough-shaped housing section is plastic.

8. A housing according to claim 1, wherein the metal lid comprises chromatized aluminum.

9. A housing according to claim 4 wherein said electronic components include at least one power transistor, and wherein said power transistor is mechanically fastened by a clip to a surface of a said heat sink which extends transverse to said PCB.

* * * * *